United States Patent
Krammer et al.

(10) Patent No.: US 10,703,206 B2
(45) Date of Patent: Jul. 7, 2020

(54) DEVICE FOR MONITORING A HIGH-VOLTAGE ON-BOARD POWER SUPPLY SYSTEM OF AN ELECTRICALLY OPERATED VEHICLE FOR THE OCCURRENCE OF OVERLOADING

(71) Applicant: Bayerische Motoren Werke Aktiengesellschaft, Munich (DE)

(72) Inventors: Josef Krammer, Holzkirchen (DE); Reiner Abl, Puchheim (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 100 days.

(21) Appl. No.: 15/417,248

(22) Filed: Jan. 27, 2017

(65) Prior Publication Data
US 2017/0129339 A1    May 11, 2017

Related U.S. Application Data

(63) Continuation of application No. PCT/EP2015/065337, filed on Jul. 6, 2015.

(30) Foreign Application Priority Data

Jul. 29, 2014  (DE) .......................... 10 2014 214 840

(51) Int. Cl.
*B60L 3/04* (2006.01)
*H02H 3/087* (2006.01)
(Continued)

(52) U.S. Cl.
CPC .................. *B60L 3/04* (2013.01); *B60L 1/00* (2013.01); *B60L 3/0023* (2013.01);
(Continued)

(58) Field of Classification Search
CPC . B60L 3/04; B60L 3/0023; B60L 1/00; G01R 19/16566; G01R 31/40; G07C 5/12; H02H 3/087; H02H 3/027; H02H 7/268
See application file for complete search history.

(56) References Cited

U.S. PATENT DOCUMENTS

| 4,491,892 A | * | 1/1985 | Lehmann | H02H 1/0007 361/101 |
| 4,631,623 A | * | 12/1986 | Gohl | H02H 3/06 327/530 |

(Continued)

FOREIGN PATENT DOCUMENTS

| CN | 1320991 A | 11/2001 |
| CN | 2914441 Y | 6/2007 |

(Continued)

OTHER PUBLICATIONS

International Search Report (PCT/ISA/210) issued in PCT Application No. PCT/EP2015/065337 dated Sep. 22, 2015 with English translation (Four (4) pages).

(Continued)

*Primary Examiner* — Thomas E Worden
(74) *Attorney, Agent, or Firm* — Crowell & Moring LLP

(57) ABSTRACT

An apparatus is provided for monitoring a high-voltage on-board power supply system of an electrically operated vehicle for the occurrence of overloading, wherein the high-voltage on-board power supply system includes as components one or more energy sources and/or one or more energy sinks which are each connected via a conductor line arrangement to a first supply potential line and to a second supply potential line. Each of the components is assigned a current sensor which is designed to detect a current flowing through the respective component and to transmit information representing the level of the current to an evaluation unit for evaluation. The evaluation unit is designed to compare (Continued)

the current with a first current threshold and a second current threshold and to output a switch-off signal at least for the component assigned to the current sensor if, as a first criterion, the level of the current and the duration of the level of the current are between the first and second current thresholds.

16 Claims, 7 Drawing Sheets

(51) Int. Cl.
    *H02H 7/26*     (2006.01)
    *B60L 1/00*     (2006.01)
    *B60L 3/00*     (2019.01)
    *G01R 19/165*     (2006.01)
    *G01R 31/40*     (2020.01)
    *G07C 5/12*     (2006.01)
    *H02H 3/027*     (2006.01)

(52) U.S. Cl.
    CPC ....... *G01R 19/16566* (2013.01); *G01R 31/40* (2013.01); *G07C 5/12* (2013.01); *H02H 3/087* (2013.01); *H02H 7/268* (2013.01); *H02H 3/027* (2013.01)

(56) References Cited

U.S. PATENT DOCUMENTS

| | | | | |
|---|---|---|---|---|
| 4,777,578 | A * | 10/1988 | Jahns | H02M 7/5387 363/132 |
| 6,356,423 | B1 * | 3/2002 | Hastings | H02H 3/087 361/93.2 |
| 6,369,460 | B1 * | 4/2002 | Endoh | B60R 16/03 307/10.7 |
| 8,432,657 | B2 * | 4/2013 | Nakamura | H02H 6/005 361/101 |
| 8,450,881 | B2 * | 5/2013 | Wortberg | H01H 9/106 307/10.1 |
| 2003/0021129 | A1 * | 1/2003 | Balakrishnan | G01R 19/16523 363/21.01 |
| 2003/0142449 | A1 * | 7/2003 | Iwata | H02H 1/0015 361/58 |
| 2004/0169968 | A1 * | 9/2004 | Mohr | H02H 7/0833 361/33 |
| 2010/0020450 | A1 * | 1/2010 | Guillot | H03K 17/0822 361/18 |
| 2011/0096448 | A1 * | 4/2011 | Wortberg | H01H 9/106 361/62 |
| 2012/0134062 | A1 * | 5/2012 | Wortberg | H02H 3/0935 361/87 |
| 2016/0079748 | A1 * | 3/2016 | Sanchez Gonzalez | H02H 3/087 361/18 |
| 2018/0029474 | A1 * | 2/2018 | Berels | B60L 58/21 |
| 2019/0214844 | A1 * | 7/2019 | Khafagy | H02H 3/087 |

FOREIGN PATENT DOCUMENTS

| | | |
|---|---|---|
| CN | 102946091 A | 2/2013 |
| DE | 43 23 604 A1 | 1/1995 |
| DE | 10 2011 004 355 A1 | 8/2012 |
| DE | 10 2011 086 495 A1 | 5/2013 |
| DE | 10 2011 088 359 A1 | 6/2013 |
| DE | 20 2014 003 691 U1 | 8/2014 |
| JP | 2009-247047 A | 10/2009 |

OTHER PUBLICATIONS

German-language Written Opinion (PCT/ISA/237) issued in PCT Application No. PCT/EP2015/065337 dated Sep. 22, 2015 (Five (5) pages).

German-language Search Report issued in counterpart German Application No. 10 2014 214 840.5 dated Jan. 21, 2015 with partial English translation (Fourteen (14) pages).

Chinese-language Office Action issued in counterpart Chinese Application No. 201580041777.5 dated Jun. 1, 2018 with English translation (15 pages).

\* cited by examiner

DEVICE FOR MONITORING A HIGH-VOLTAGE ON-BOARD POWER SUPPLY SYSTEM OF AN ELECTRICALLY OPERATED VEHICLE FOR THE OCCURRENCE OF OVERLOADING

CROSS REFERENCE TO RELATED APPLICATIONS

This application is a continuation of PCT International Application No. PCT/EP2015/065337, filed Jul. 6, 2015, which claims priority under 35 U.S.C. § 119 from German Patent Application No. 10 2014 214 840.5, filed Jul. 29, 2015, the entire disclosures of which are herein expressly incorporated by reference.

BACKGROUND AND SUMMARY OF THE INVENTION

The invention relates to an apparatus for monitoring a high voltage vehicle power supply system of an electrically operable vehicle for the presence of an overload. The high voltage vehicle power supply system comprises, as components, one or more energy sources and/or one or more energy sinks that are connected via a respective conductor run arrangement to a first supply potential line and a second supply potential line.

To protect individual conductor runs in a high voltage vehicle power supply system, fusible links matched to the respective different current intensities and line cross sections are used. The fusible links are designed to trip in the event of a very large flow of current as a result of low-resistance connection of the live conductors, in order to protect the component or components connected to the relevant conductor run from destruction or damage. On account of the limited space available in a vehicle, the fusible links are not arranged in a separate fuse distributor, as is known from fuses in a low voltage vehicle power supply system (12 V vehicle power supply system). Instead, existing components, such as e.g. a charging device or power electronics, have additional current connections fitted that are provided with fuses in these components.

Fusible links have a relatively high degree of variance in terms of the current from which they trip. In addition, the current, referred to as the tripping current, is dependent on the ambient temperature. If the tripping current at the fusible link is now larger than a continuous current design of the conductor run to be protected, then an overload situation can arise that results in damage to the conductor run and possibly to the components connected thereto. In order to be able to safely rule out an overload situation, the lines of a respective conductor run need to be provided with a high level of overdimensioning, such that the tripping current of the fusible link is ideally smaller than the permitted continuous current through the conductor run. This results in increased weight for the vehicle, however, which in turn adversely affects energy efficiency.

It is the object of the present invention to provide an apparatus for monitoring a high voltage vehicle power supply system of an electrically operated vehicle for the presence of an overload in which no overdimensioning of the lines of a conductor run arrangement of the high voltage vehicle power supply system is necessary.

This and other objects are achieved by an apparatus for monitoring a high voltage vehicle power supply system of an electrically operable vehicle for the presence of an overload, wherein the high voltage vehicle power supply system comprises, as components, one or more energy sources and/or one or more energy sinks that are connected via a respective conductor run arrangement to a first supply potential line and to a supply potential line. It goes without saying that a component is also intended to be understood to mean a component that is both an energy source and an energy sink.

Each of the components have an associated current sensor that is designed to register a current flowing through the relevant component and to transmit a piece of information representing the level of the current to an evaluation unit for evaluation, wherein the evaluation unit is designed to compare the current with a first current threshold and a second current threshold and to output a disconnection signal at least for the component associated with the current sensor when, as a first criterion, the level of the current and the period of the level of the current is between the first and second current thresholds.

A respective current sensor may, by way of example, be realized in the form of a shunt or a Hall sensor. In principle, however, any desired sensor can be used that permits the current flowing through one or more components of a conductor run to be measured.

The evaluation unit may be for example a separate controller or a particular microcontroller in a controller that is already in place in the vehicle. The evaluation unit may alternatively also be realized in software and run on a controller that is already in place in the vehicle. Such a controller could, by way of example, be a disconnection device that ensures that the high voltage vehicle power supply system performs isolation of energy sources from the remainder of the high voltage vehicle power supply system in the event of an accident. In this regard, an appropriate disconnection device is typically connected to the relevant components to be disconnected via dedicated hardware lines.

The disconnection signal can, by way of example, be used by a device for processing the disconnection signal, in such a way as to disconnect at least the components associated with the current sensor or just to restrict the power of said components. The disconnection signal can also be used to isolate all energy sources from the high voltage vehicle power supply system.

The apparatus allows an overload to be detected that is situated as a result of a current between the permitted current in the normal situation (first current threshold) and the tripping current of a fuse element, such as e.g. a high voltage fusible link. The apparatus allows large line cross sections of the conductor run arrangement and resultant demands on corresponding plug systems to be dispensed with. Furthermore, high integrity demands are met by the apparatus. The overload protection can be designed very precisely by virtue of the choice of appropriate values for the first and second current thresholds. The apparatus is inexpensive to provide, since only additional costs for providing the current sensors are incurred.

The apparatus can be realized alternatively by hardware circuits and/or software, allowing high integrity levels (automotive security integrity level, ASIL). The apparatus furthermore allows the disconnection of a component to be reset in an overload situation by virtue of appropriate actuation of the evaluation unit. This makes resetting simpler and quicker to perform in comparison with replacement of a fusible link. Short-circuit protection by fuse elements can be designed exclusively for the short-circuit situation and does not need to take account of the overload situation.

This allows erroneous tripping instances to be avoided for high operating currents, whereas isolation capability is ensured for high currents.

According to one configuration, the first current threshold is represented in a current/time graph by a prescribed first characteristic curve that has a first section in which the current has a first, high current value from a first time to a second time and that has a second section in which the current has a second, comparatively lower current value from the second time. The first characteristic curve therefore corresponds for example to the permitted current in the conductor run arrangement in the normal situation. In this case, the permitted current in the normal situation allows an increased switching-on current to be drawn for a particular time. By contrast, a decreased continuous current is provided in the normal situation.

The first current threshold can also be chosen arbitrarily, in order e.g. to tolerate a certain degree of overload beyond the normal situation. The first characteristic curve is then situated to the right of the permitted current in the conductor run arrangement in the normal situation.

According to a further configuration, the second current threshold is represented in a current/time graph by a temperature-dependent, nonlinear family of characteristic curves that has a substantially exponentially falling profile. The greater the temperature (e.g. the ambient temperature), the smaller the difference between a current value of the first current threshold and a current value of the second current threshold at one and the same time. The profile of the family of characteristic curves in the current/time graph and particularly the distance between a current value of the first current threshold and a current value of the second current threshold at a particular time can be chosen by virtue of design and dimensioning of a fusible link. In principle, it is expedient if each current value of the second current threshold at any time is larger than the current value of the first current threshold at the same time, in order to have no undesirable tripping of the fuse in an uncritical operating situation.

According to a further configuration, the evaluation unit is designed to additionally compare the current with a third current threshold and to output a disconnection signal at least for the component associated with the current sensor when, as a second criterion, the level of the current is between the second and third current thresholds. In this case, the third current threshold corresponds to the line characteristic curve stipulated by the thickness and the cross section of a line.

The third current threshold is represented in a current/time graph by a temperature-dependent, nonlinear characteristic curve that grasps a substantially exponentially falling profile and corresponds to the line characteristic curve. The lower the ambient temperature of the vehicle, the greater the difference between a current value of the third current threshold and a current value of the second current threshold at one and the same time.

The high voltage vehicle power supply system can include a disconnection device that isolates current sources from the first and second supply potential lines using a tripping signal, wherein the disconnection device is designed to generate the tripping signal in the event of an acceleration, ascertained by a sensor, that exceeds a prescribed limit value, the disconnection signal output by the evaluation unit being suppliable to the energy sources as a tripping signal. This allows the component or components connected to a conductor run to be isolated from the high voltage vehicle power supply system in an overload situation, by means of components that are in place in a vehicle.

The evaluation unit may be designed to output the disconnection signal only when the third criterion satisfied is a prescribed period since the time of the onset of the first, and optionally also the second, criterion. In this case, the length of the prescribed period may be dependent on the level of the measured current. According to this configuration, it becomes possible to distinguish the overload situation between an uncritical region and an unprotected region. The uncritical overload situation exists when the current registered by the current sensor is between the permitted current through a conductor run in the normal situation (first current threshold) and the current characteristic curve of the continuous current design (third current threshold value). A direct risk to the line and the component connected to the line does not exist. By contrast, immediate disconnection is effected if there is a critical overload situation in which the measured current is between the current characteristic curve of the continuous current design of the line (third current threshold) and the tripping characteristic curve of the high voltage fusible link.

In order to inform the driver or a workshop that an (uncritical) overload situation has arisen, the evaluation unit may be designed to output a diagnosis or fault signal when the first and/or the second criterion is satisfied.

The evaluation unit may further be designed to store one or more of the following pieces of information in a memory on the onset of the first and/or second criterion: an identifier of the current sensor that has registered the increased current exceeding the first current threshold; the level of the measured current; the period of occurrence of the increased current. As a result, by reading the relevant piece of information or pieces of information, it is possible to establish, for example during a workshop visit, that, and even in which conductor run, a fault is occurring. This facilitates fault finding and correction.

According to a further configuration, the conductor run arrangement has one or more fusible links provided in it, wherein each fusible link, when a prescribed current that is larger than the second threshold value is exceeded in the conductor run section in which the relevant fusible link is arranged, trips to protect the components connected to the conductor run.

Each component can have an associated fusible link. Alternatively, multiple components can have an associated shared fusible link.

In a further configuration, each component can have an associated current sensor. Alternatively, multiple components can also have an associated shared current sensor.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
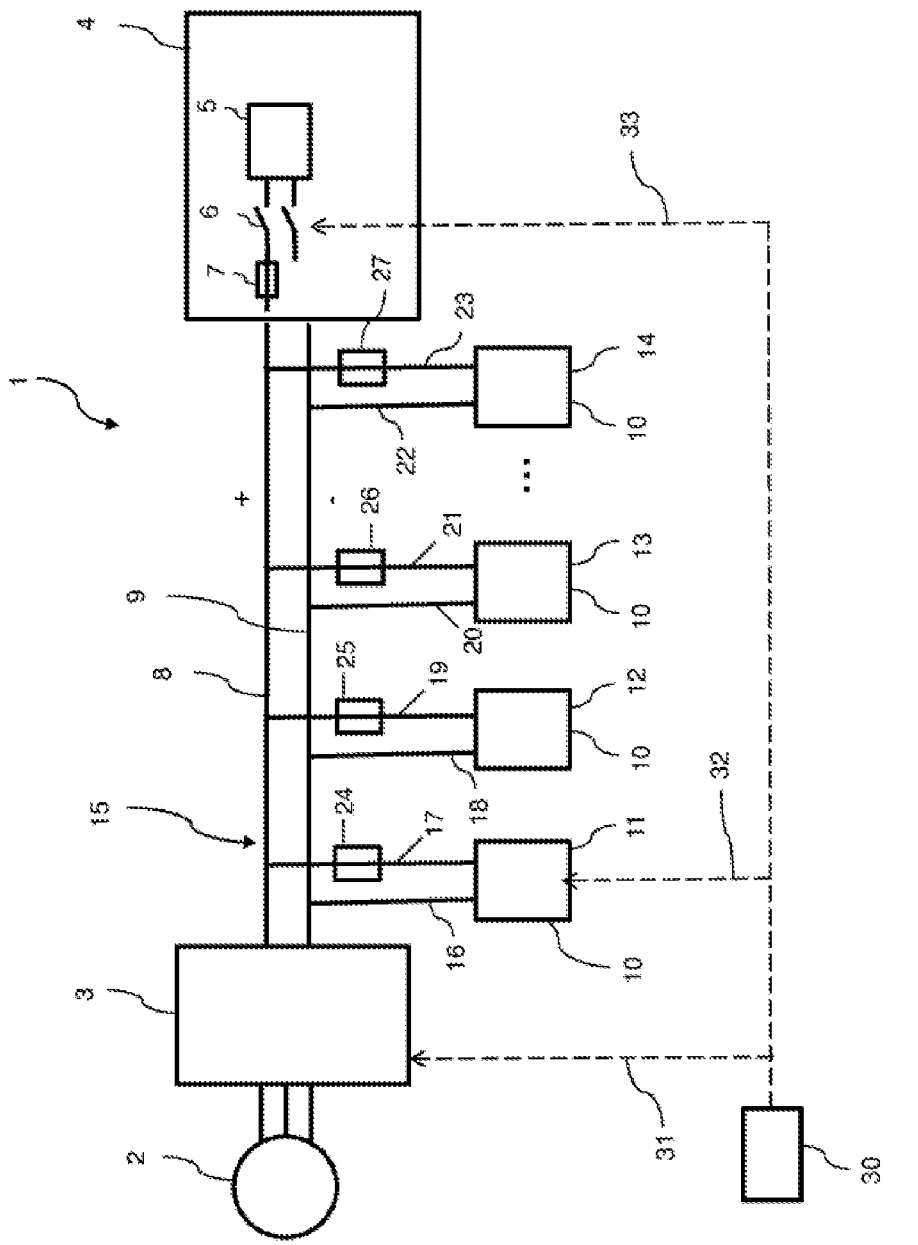
FIG. 1 is a schematic representation of a high voltage vehicle power supply system of an electrically operable vehicle based on the prior art.

FIG. 1 shows a schematic representation of a high voltage vehicle power supply system 1 of an electrically operable vehicle. The electrically operable vehicle may be a hybrid vehicle or an electric vehicle. The high voltage vehicle power supply system 1 comprises, as essential components, a drive motor 2, control electronics 3, an electrochemical store 4 (storage battery) and a conductor run arrangement 15. The drive motor 2 is supplied with electric power for driving the drive motor 2 via the control electronics 3, which are connected to the energy store 4 via a first supply line 8 and a second supply line 9. For energy recuperation, appropriate actuation of the drive motor 2 and the control electronics 3 allows energy to be stored in the energy store 4 again.

In a manner that is known to a person skilled in the art, the energy store 4 comprises the actual electrochemical storage cells 5, only a single one of which is schematically represented for the sake of clarity. The storage cells 5 are connected to the supply lines 8, 9 via a controllable switching element 6, e.g. a contactor or relay, and a fusible link 7 connected in series therewith. The fusible link 7 is, in practice, connected to just one of the supply lines 8 or 9. The fusible link 7 is designed for a maximum permitted current via the supply lines 8, 9, the tripping current being above the maximum permitted current.

Furthermore, the high voltage vehicle power supply system 1 comprises a number of components 10 that are either an energy source and/or an energy sink. By way of example, the component 10 is an energy source 11 in the form of a charger. The reference symbols 12, 13 and 14 denote energy sinks, wherein the energy sink 12 is a compressor of an air conditioning installation, for example, the energy sink 13 is a heater and the energy sink 14 is a DC/DC converter for a 12 V vehicle power supply system of the vehicle, which 12 V vehicle power supply system is not shown in the figure for the sake of simplicity.

The components 10 are connected via respective lines or, generally, conductor run sections to the first and second supply lines 8, 9. As such, by way of example, the energy source 11 is connected via a line 16 (also referred to as a conductor run), the energy sink 12 is connected via a line 18, the energy sink 13 is connected via a line 20 and the energy sink 14 is connected via a line 22, to the second supply line 9. The energy source 11 is connected via a line 17 (also referred to as a conductor run), the energy sink 12 is connected via a line 19, the energy sink 13 is connected via a line 21 and the energy sink 14 is connected via a line 23, to the first supply line 8. The lines 17, 19, 21, 23 have respective fusible links 24, 25, 26, 27 arranged in them.

The cross section of the lines 16 to 23 and the dimensioning of the fusible links 24 to 27 is dependent on the rated data at the respective components and lines. This means, by way of example, that the lines 16, 17 can have a different dimensioning than the lines 18 to 23 of the energy sinks 12 to 14. Similarly, respective lines associated with a component 10 can have a different cross section in comparison with the lines of another component. The dimensioning is effected according to the requirements of the component to be supplied with power or power-supplying component 10.

FIG. 1 further depicts a disconnection device 30 that, via tripping signal paths 31, 32, 33, is capable of disconnecting the energy sources of the high voltage vehicle power supply system 1, or of isolating them from the supply lines 8, 9, when a prescribed criterion exists. The tripping signal paths may be actualized e.g. by way of communication lines, i.e. lines via which communication signals can be transmitted. Such a criterion consists, by way of example, in a prescribed acceleration being exceeded, which indicates a crash by the vehicle. The energy sources actuated by the disconnection device 30 are the control electronics 3, the energy store 4 and the energy source 11 in the form of a charger. Whereas the isolation of the energy store 4 from the supply lines 8, 9 is effected by the actuation of a dedicated switching element 6, the isolation of the drive motor 2 is effected by actuating the control electronics 3 and the isolation of the energy source 11 is effected by actuating switching elements that these components contain. In the case of the control electronics 3 and the energy source 11 in the form of a charger, these switching elements are switching elements of respective inverters.

Figure 2:
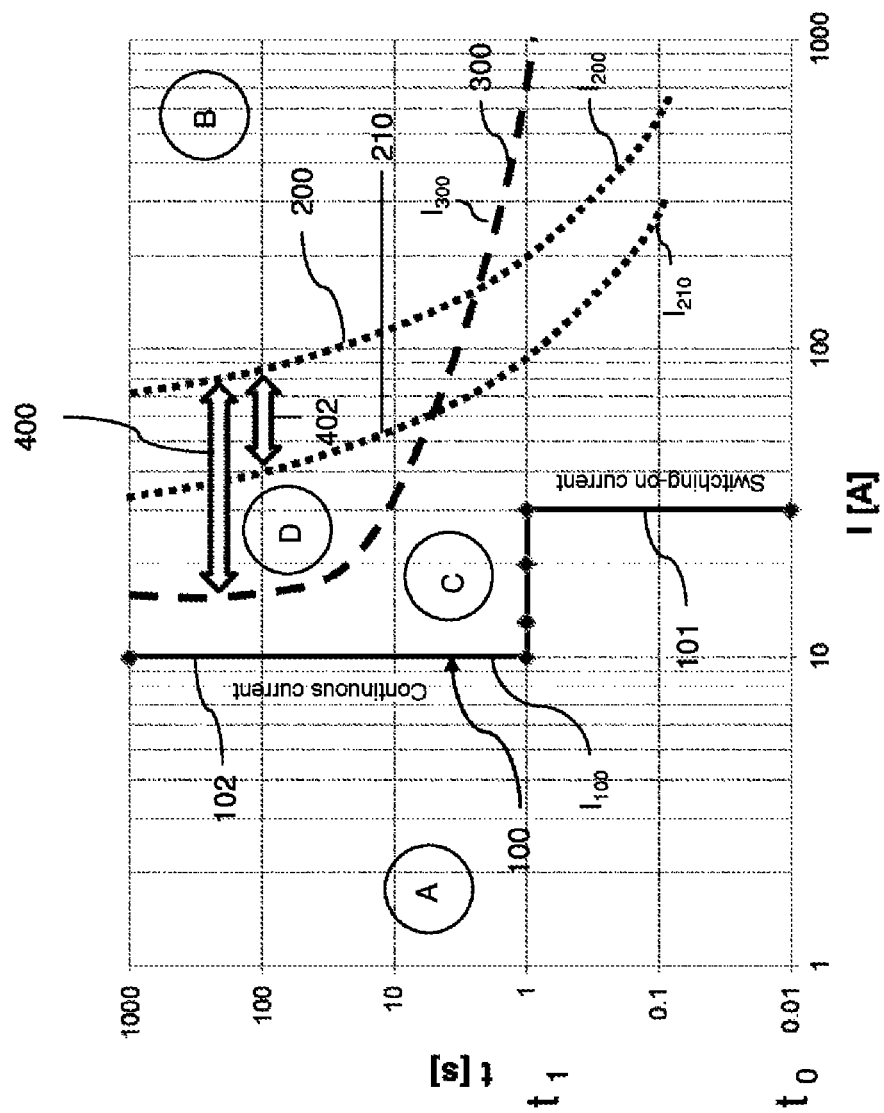
FIG. 2 is a current/time graph that shows the profile of the characteristic curves of the tripping current, of the continuous current design of a conductor run and of the rated current through a conductor run represented in FIG. 1.

FIG. 2 displays a current/time graph (I/t graph) that illustrates the design of the high voltage vehicle power supply system from FIG. 1. Both the current I and the time t are plotted logarithmically over the axes. The reference symbol 100 represents a first characteristic curve that represents the permitted current of a conductor run, with the component(s) connected thereto, in the normal situation. Subsequently, e.g. the lines 16, 17 and the energy source 11 connected thereto are considered to be a conductor run. The first characteristic curve 100 comprises a first section 101 that extends from a time t0 to a time t1. The first section 101 denotes the permitted switching-on current at the component 11. Merely by way of example, this is 30 A in the exemplary embodiment. From the time t1, the first characteristic curve 100 merges abruptly into a second section 102 that represents the continuous current of the component 11. Merely by way of example, the continuous current of the component 11 under consideration is intended to be 10 A. In the exemplary embodiment chosen in FIG. 1, the switching-on time lasts approximately 1 second (t1=1 sec.). From this time, i.e. t>t1, the continuous mode or normal mode of the component 10 occurs.

The reference symbols 200 and 210 denote a second characteristic curve that denotes a tripping characteristic curve of the high voltage fusible link 24 in the line 17. For the sake of simplicity, only two tripping characteristic curves for two different temperatures T1 and T2 are depicted. In practice, the tripping characteristic curve is formed by a family of characteristic curves, for example between the characteristic curves 200 and 210, the respective characteristic curve being dependent on the ambient temperature of the vehicle. The characteristic curve 200 holds, by way of example, for a temperature T1 that corresponds to the specified minimum ambient temperature, e.g. 40° C. The characteristic curve 210 holds for a second temperature T2, which represents for a maximum specification temperature of the surroundings of the vehicle, e.g. +85° C.

The reference symbol 300 represents a third characteristic curve of the line to be protected, in the present exemplary embodiment the lines 16, 17. The third characteristic curve 300 represents the maximum permitted operating current of the lines that are protected by the fusible link.

A critical situation, what is known as an overload situation, is denoted by region D. The region D is formed between the second characteristic curve valid for a temperature T (in the exemplary embodiment the characteristic curve 200) and the third characteristic curve 300. 402 represents the fluctuation range of the second characteristic curve between the maximum limit temperatures T1 and T2. It is readily evident that when the current delivered by the energy sink 11, for example, is in the region D, the current is not sufficiently large to cause the fusible link to trip. On the other hand, the current is above the maximum tolerable continuous current design of the lines 16, 17. The result of this is that an insulation surrounding the lines 16, 17 melts and this can bring about further faults or damage in the vehicle.

A situation that is uncritical, because it is protected by means of the fusible link, is denoted by region B. In this region B, which is situated to the right of a second characteristic curve 200, 210, that holds for a particular temperature, and above the third characteristic curve 300, the current delivered by the component 11 is larger than the tripping current of the fusible link. As a result, both the lines 16, 17 and the component are protected.

The region denoted by A, which is situated to the left of the first characteristic curve 100, is the valid operating region of the component and of the associated line. There is no risk in this region.

C denotes an overload region that is situated between the first characteristic curve 100 and the second characteristic curve 200. In this region too, there is already a problem, but one that does not immediately present a risk for the lines and for the component(s) connected thereto.

The exemplary embodiments described below are capable of using little complexity in performing monitoring of the regions C and D in which the fusible link does not yet trip, but the current flowing through a component is larger than the permitted current in the normal situation.

Figure 3:
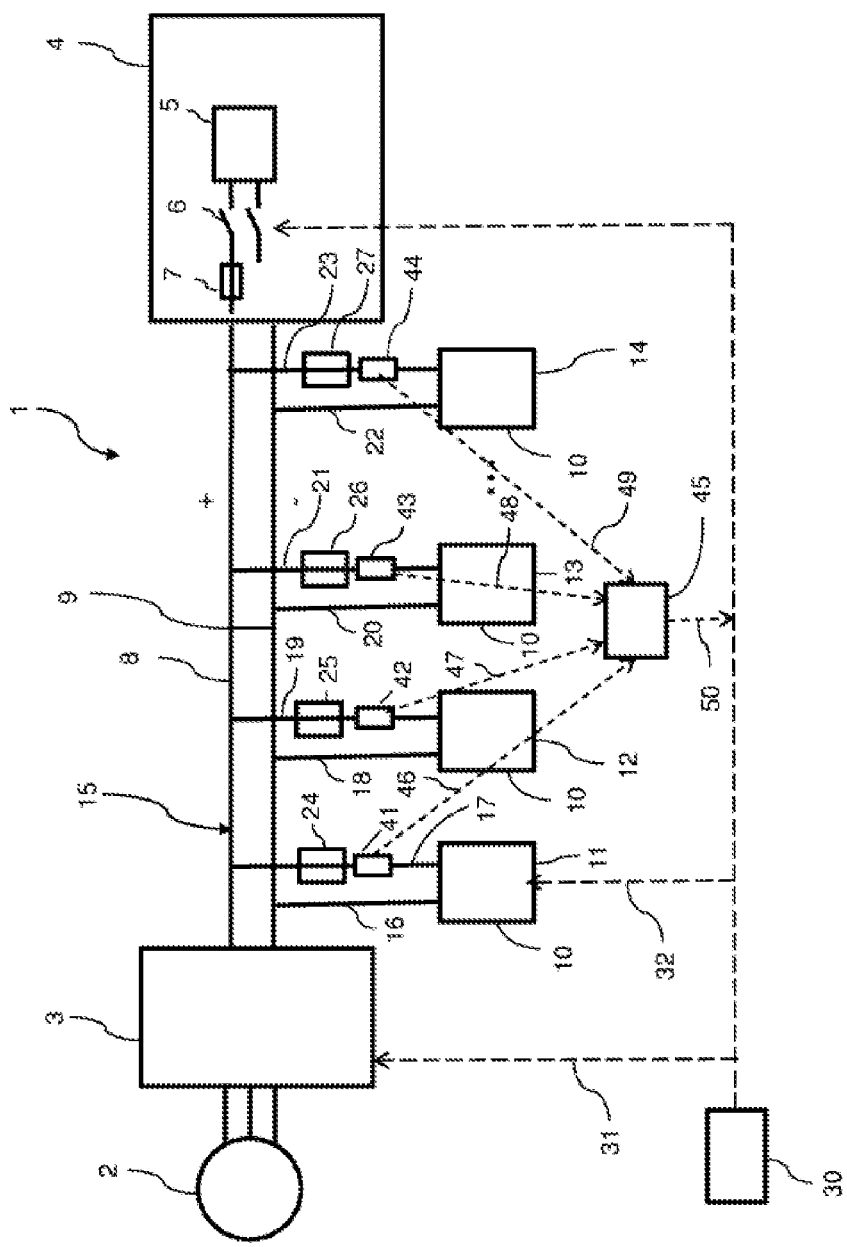
FIG. 3 is a schematic representation of a high voltage vehicle power supply system, according to the invention, of an electrically operable vehicle according to a first variant configuration.

A first variant configuration, shown in FIG. 3, of the apparatus according to the invention is based on the arrangement described in FIG. 1, which means that now only the differences with respect thereto are described. As is readily evident, the lines 17, 19, 21, 23 (i.e. conductor run sections) have respective current sensors 41, 42, 43, 44 arranged in series with the high voltage fusible links 24, 25, 26, 27. The current sensors may be formed by shunts or a Hall sensor, for example. Each of the current sensors associated with a component is designed to register a current flowing through the relevant component 10 and to transmit a piece of information representing the level of the current to an evaluation unit 45. Signal paths that are required for this purpose are represented by dashed lines and provided with the reference symbols 46, 47, 48, 49.

The evaluation unit 45, which may be realized for example as a separate controller or else as additional software of a controller in place for the vehicle, is designed to compare the piece of information representing the current with current thresholds stored in the evaluation unit. The comparison is made for each conductor run section to be monitored with respect to a first current threshold that is represented in the current/time graph by the aforementioned first characteristic curve 100. As a result, it is possible to establish whether the current flowing through a component 10 is larger than the permitted current in the normal situation defined by the first characteristic curve 100.

Further, a comparison is made with a second current threshold. The second current threshold is represented in the current/time graph by the temperature-dependent nonlinear second characteristic curve 200 or 210 for a currently valid temperature. If the current is smaller than the current prescribed by the second current threshold, then the component is operated either in the overload region C or in the overload region D.

If just the exceeding of the current permitted for the normal situation is intended to result in disconnection, then the evaluation unit 45 can output a disconnection signal 50. In the present configuration, this disconnection signal is treated as a tripping signal output by the disconnection device 30 and is delivered to the energy sources 3, 4, 11 via the tripping signal paths 31, 32, 33. As a result, the corresponding switching elements are opened, as a result of which the high voltage vehicle power supply system is isolated from all energy sources.

In a variant configuration that is not depicted, the disconnection signal could also be used to isolate just that component 10 that has an increased operating current from the high voltage vehicle power supply system 1.

Figure 4:
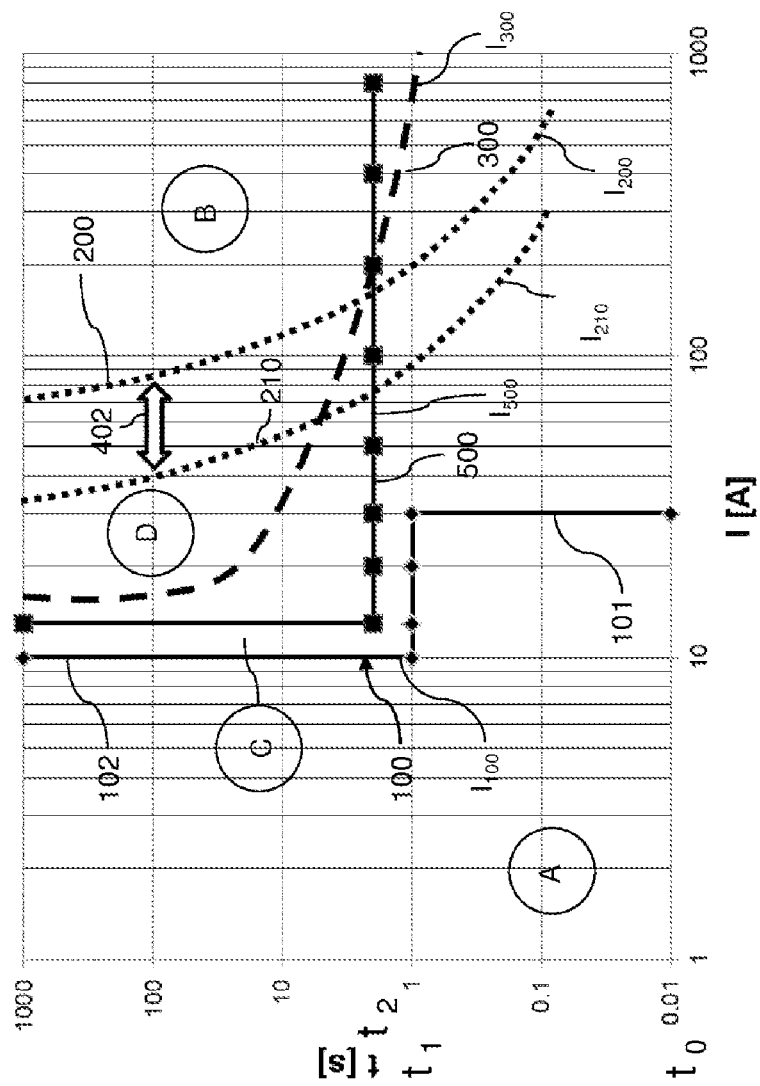
FIG. 4 is a current/time graph that illustrates the manner of operation of the apparatus according to the invention.

Output of the disconnection signal 50 can also be effected on the basis of a fifth characteristic curve 500 (cf. FIG. 4) that is situated between the first characteristic curve 100 and the third characteristic curve 300. By way of example, the fifth characteristic curve 500 may be configured such that it has a horizontal profile at a time t2, which is later than the time t1, and, beyond the time t2, has a prescribed current that is larger than the prescribed current in the second section 102 of the first characteristic curve 100. The result of this is that the disconnection signal 50 is output only when the operating current of the component is to the right of or above the fifth characteristic curve.

Figure 5:
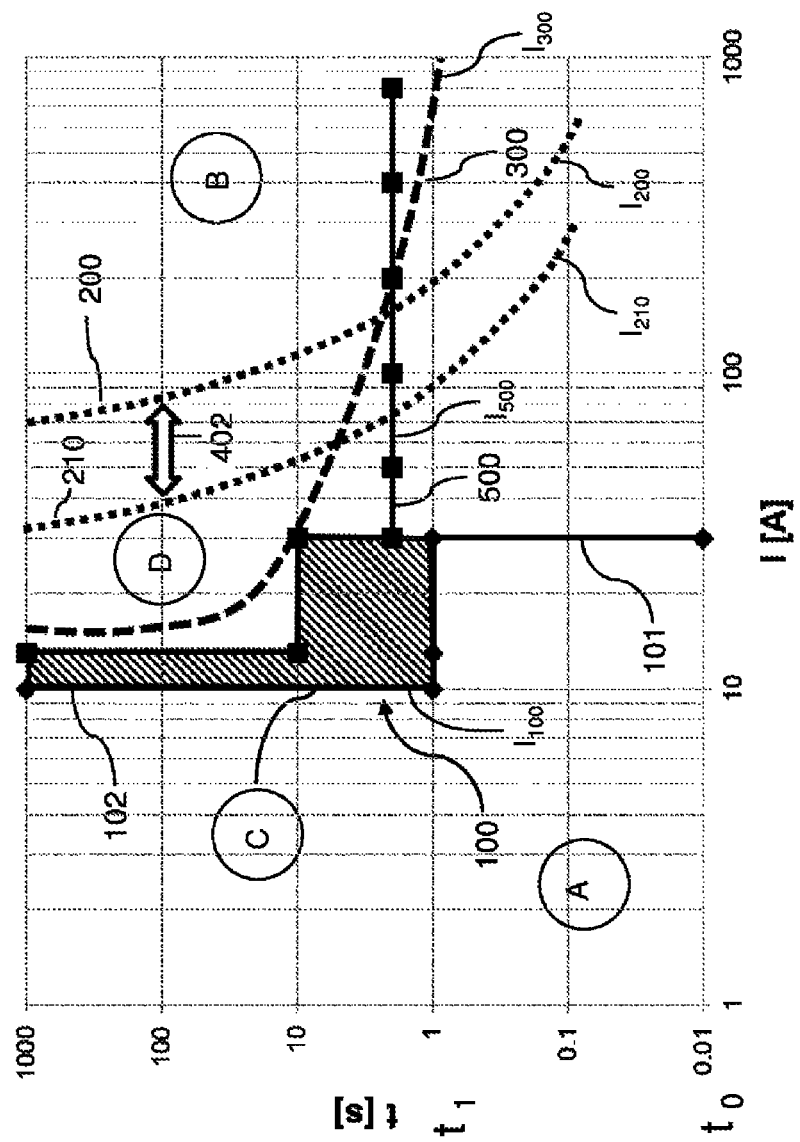
FIG. 5 is a current/time graph that is augmented by a warning region within an overload region.

The region C located between the first characteristic curve 100 and the fifth characteristic curve 500 can be interpreted as an overload region with further possible use. The characteristic curve can be modified by further graduation such that further areal regions located in the region C are also defined as an overload region with further possible use, i.e. when the operating current is between the characteristic curve 100 and an appropriately graduated profile of the fifth characteristic curve 500, no disconnection signal is output. This situation is depicted by way of example in FIG. 5.

Figure 6:
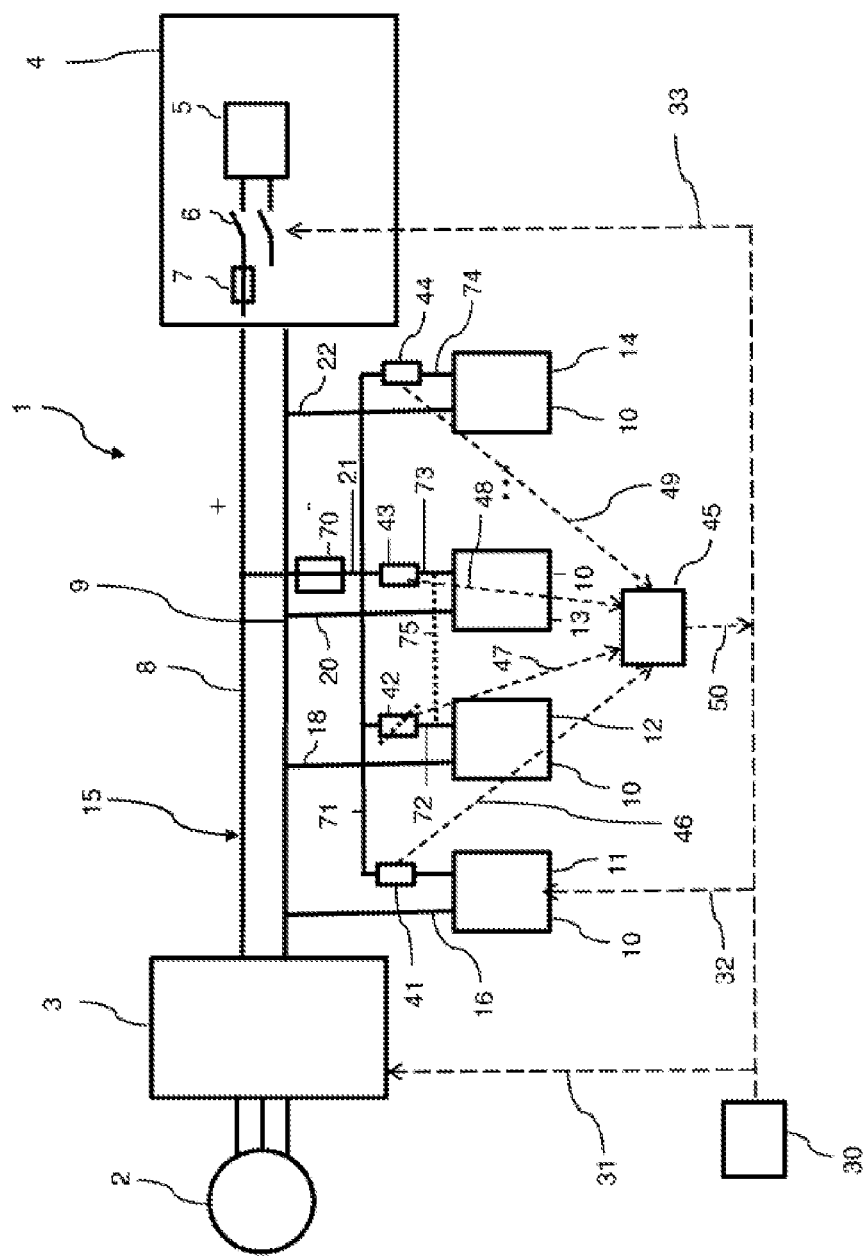
FIG. 6 is a schematic representation of a high voltage vehicle power supply system, according to the invention, of an electrically operated vehicle according to a second variant configuration.

FIG. 6 shows a second exemplary embodiment of a high voltage vehicle power supply system, according to the invention, of an electrically operated vehicle for monitoring for the presence of an overload. The second exemplary embodiment is distinguished from the first exemplary embodiment, shown in FIG. 3, in that the components 10 are, by way of example, connected via a shared node to the line 21 and hence to the first supply line 8 via just a single high voltage fusible link 70. The line 21 needs to be provided with heavier dimensions in comparison with the line 21 in the exemplary embodiment shown in FIG. 3, provided that there is provision for the energy sinks 12, 13, 14 to be operated at the same time. In a corresponding manner, the fusible link 70 also needs to be dimensioned differently. The energy source 11 is connected via a line 71 to the line 21, the energy sink 12 is connected via a line 72 to the line 21, the energy sink 13 is connected via a line 73 to the line 21 and the energy sink 14 is connected via a line 74 to the line 21.

In a first variant, which is represented by a solid line, each of the components 10 has an associated dedicated current sensor 41, 42, 43, 44. In a configuration alternative thereto, which is represented by a dashed line with the reference symbol 75, the current sensor 42 can be dispensed with if the energy sink 12 is linked via the line 75 to the current sensor in the line 73. In this case, the current sensor 43 monitors the energy sinks 12 and 13. The registering of the current flowing through the relevant conductor run section and the transmission of a piece of information representing the current to the disconnection device 30 are effected as described above.

Figure 7:
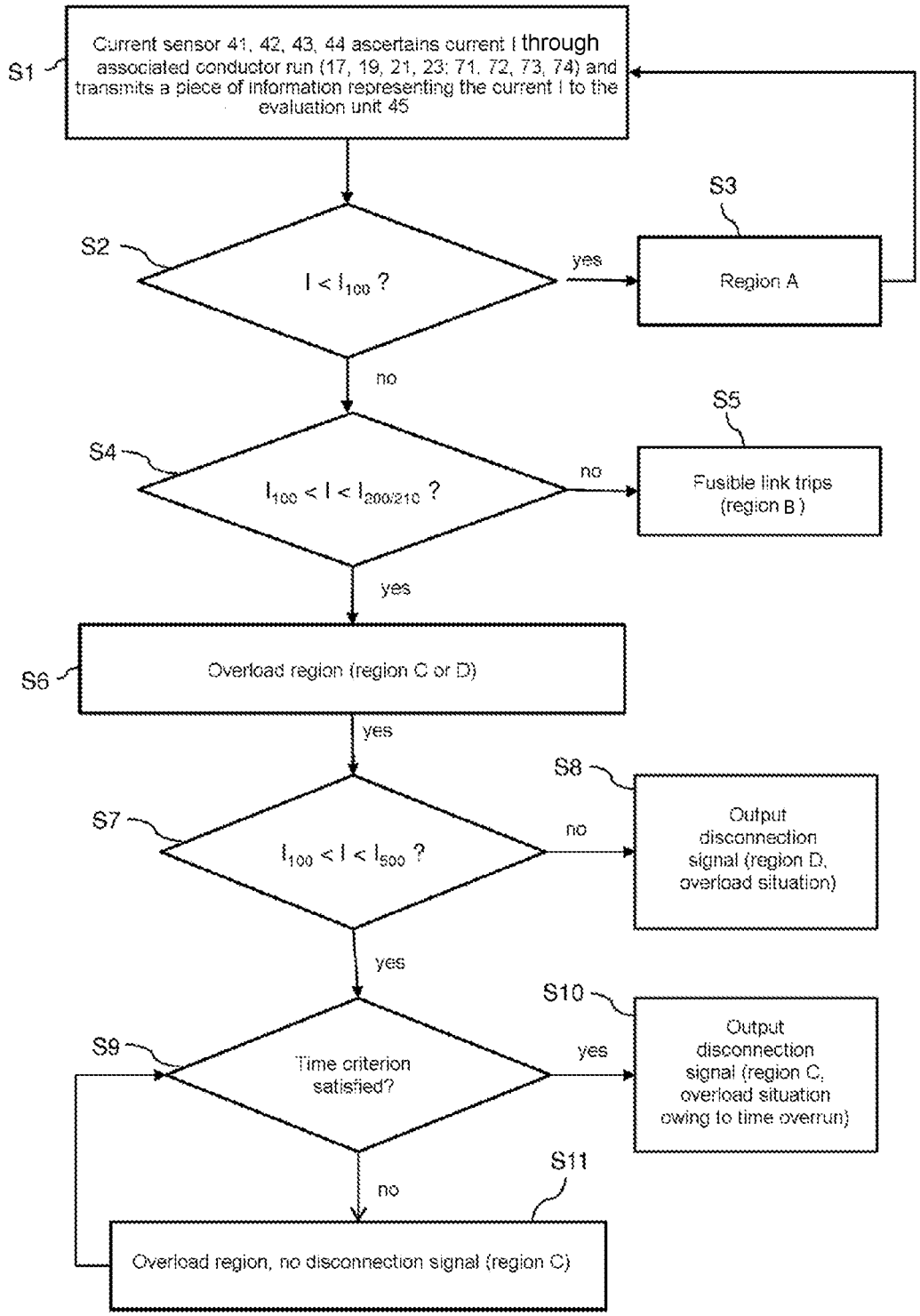
FIG. 7 is a schematic representation of a sequence for monitoring a high voltage vehicle power supply system of an electrically operated vehicle for the presence of an overload.

FIG. 7 shows a schematic representation of the sequence of the monitoring for the presence of an overload in a flowchart. In a first step S1, the current sensors 41, 42, 43, 44 determine a respective current flowing through the associated conductor run 17, 19, 21, 23 (FIG. 4) or 71, 72, 73, 74 (FIG. 6 in the variant with the solid line) and transmit a respective piece of information representing the current I to the evaluation unit 45. In a step S2, the evaluation unit 45 checks whether the measured current I is smaller than the current threshold value I100 defined by the first characteristic curve 100. If this is the case ("YES"), then the operating region A is determined (S3). The method continues in this arm with step S1.

If the condition in step S2 is not satisfied ("NO"), then a check is performed in step S4 to determine whether the measured current I is larger than the first current value I100, represented by the first characteristic curve 100, and smaller than a second current value I200/210, represented by the second, temperature-dependent characteristic curve 200 or 210. If this is not the case, then the operating range B obtains. In this case, the fusible link in the relevant line run trips (S5).

If the condition in step S4 is satisfied ("YES"), then it is established in step S6 that operation takes place in the overload region. The overload region is defined by the region C or D. In step S7, a check is performed to determine whether the current is larger than the first current threshold value I100, represented by the first characteristic curve 100, and smaller than a defined current threshold value I500, represented by the characteristic curve 500. The characteristic curve 500 largely reproduces the profile of the line characteristic curve (third characteristic curve 300), the profile of which is not known to the evaluation unit in detail. If this is not the case ("NO"), then it is established in step S8 that there is an overload situation in the operating region D. If the condition in step S7 is satisfied ("YES"), then a check is performed to determine whether a prescribed time criterion is satisfied. If this is not satisfied, i.e. a prescribed time limit has not yet been reached, then no disconnection signal is output, since operation takes place in region C. This is an overload region with further possible use, as depicted in shaded form by way of example in FIG. 5. The check to determine whether the time criterion is satisfied in step S9 takes place iteratively, for which reason step S9 is repeated. As soon as the time criterion is satisfied ("YES"), the disconnection signal 50 is output. In this case, a continuously present fault situation is assumed, for which reason there is an overload situation on account of a time overrun.

The invention therefore proposes that the current paths of a high voltage vehicle power supply system that need to be protected against an overload have current sensing provided in them. In this case, disconnection mechanisms that are in place, such as for example a disconnection device for a crash, can be used, which disconnect the high voltage vehicle power supply system.

Disconnection can take place in coordinated fashion. Since an overload situation normally needs to be dealt with only after a certain reaction time, there is the possibility of the system being disconnected with a time delay and an easily manageable situation being produced in the vehicle. By way of example, this provides the opportunity for the vehicle also to be parked.

The short-circuit protection is realized using known fuse apparatuses, such as for example fusible links. It is possible, through the provision of appropriate current sensors in different conductor run sections, to reduce the number of fusible links, as is shown in the exemplary embodiment of FIG. 6.

The current sensors furthermore allow location of a fault. To this end, the evaluation unit can store an identifier of a current sensor delivering an increased current. On the basis of the identifier, it is possible to infer the conductor or conductor run section and hence any defective component. The level of an overcurrent allows establishment of the severity of the fault in an overload situation. Furthermore, the information provided by the current sensors can be used to plausiblize the high voltage vehicle power supply system.

Since fusible links or comparable protection apparatuses now need to be provided exclusively for the short-circuit situation, they can be designed consistently for the short-circuit situation. This allows, in particular, erroneous tripping instances for high operating currents to be avoided, since these are now detected by the approach according to the invention.

LIST OF REFERENCE SYMBOLS

1 High voltage vehicle power supply system
2 Drive motor
3 Control electronics
4 Electrochemical store (battery)
5 Storage cell(s)
6 Switching element (contactor or relay)
7 Fusible link
8 First supply line
9 Second supply line
10 Component
11 Energy source
12 Energy sink (e.g. compressor of an air conditioning installation)
13 Energy sink (e.g. heater)
14 Energy sink (e.g. DC/DC converter for 12V vehicle power supply system)
15 Conductor run arrangement
16 Line
17 Line
18 Line
19 Line
20 Line
21 Line
22 Line
23 Line
24 Fusible link
25 Fusible link
26 Fusible link
27 Fusible link
30 Disconnection device
31 Tripping signal path
32 Tripping signal path 33 Tripping signal path
41 Current sensor
42 Current sensor
43 Current sensor
44 Current sensor
45 Evaluation unit
46 Disconnection path
47 Disconnection path
48 Disconnection path
49 Disconnection path
50 Disconnection signal path
70 Fusible link
71 Line
72 Line
73 Line
74 Line as an alternative to line 72 and current sensor 42
t Time
t1 First time
t2 Second time
I Current
100 First characteristic curve in the Ft graph
101 First section
102 Second section
200 Second characteristic curve in the I/t graph at temperature T1
210 Second characteristic curve in the I/t graph at temperature T2 (where T2>T1)
300 Third characteristic curve of the line to be protected (line characteristic curve)
400 Unprotected temperature range
402 Fluctuation range of the second characteristic curve between T1 and T2
500 Characteristic curve produced by evaluation unit 500 for the output of a disconnection signal
A Operating region
B Tripping of a fusible link
C Overload region with further possible use
D Overload region The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A system, comprising:
    a high-voltage vehicle power supply system of an electrically operable vehicle, the high-voltage vehicle power supply system operating between 48 and 400 volts and having the following components electrically connected via power supply lines:
        one or more energy sources and/or energy sinks having fusible links connected via respective lines of a conductor run arrangement to the power supply lines,
        a vehicle storage battery, and
        drive motor control electronics; and
    a monitoring apparatus, comprising:
        at least one current sensor, wherein each current sensor is associated with a respective component of the high-voltage vehicle power supply system, and wherein each current sensor is configured to measure and transmit current-level-over-time data reflective of a respective current level of a respective current flowing through the respective component; and
        an evaluation unit, configured to:
            receive the current-level-over-time data,
            compare the current-level-over-time data with a first current-level-over-time threshold and a second current-level-over-time threshold, and
            output a disconnection signal electrically disconnecting the respective component when, as a first criterion, the respective current is between the first and second current-level-over-time thresholds.

2. The system of claim 1, wherein the first current-level-over-time threshold is represented in a current/time graph by a prescribed first characteristic curve that has a first section having a first, higher current level from a first time to a second time and a second section having a second, comparatively lower current level from the second time.

3. The system of claim 1, wherein the evaluation unit is further configured to compare the respective current with a third current-level-over-time threshold and to output the disconnection signal at least for the respective component associated with each of the at least one current sensor when, as a second criterion, the respective current is between the second and third current-level-over-time thresholds.

4. The system of claim 1,
    wherein the high voltage vehicle power supply system further comprises a disconnection device that isolates current sources from first and second supply potential lines using a tripping signal,
    wherein the disconnection device is further configured to generate the tripping signal in the event of an acceleration, ascertained by a sensor, exceeding a prescribed limit, and
    wherein the disconnection signal output by the evaluation unit is supplied to an energy source or an energy sink of the one or more energy sources and/or energy sinks as a tripping signal.

5. The system of claim 1, wherein the conductor run arrangement has one or more fusible links provided in it, wherein each fusible link, when a prescribed current that is larger than the second current-level-over-time threshold is exceeded in the conductor run section in which the relevant fusible link is arranged, trips to protect each of the respective components connected to the conductor run.

6. The system of claim 1, wherein each of the respective components has an associated fusible link.

7. The system of claim 1, wherein multiple respective components have an associated shared fusible link.

8. The system of claim 1, wherein each of the respective components has a separate associated current sensor.

9. The system of claim 1, wherein multiple respective components share an associated current sensor.

10. The system of claim 2, wherein the second current-level-over-time threshold is represented in the current/time graph by a temperature-dependent, nonlinear family of characteristic curves that has a substantially exponentially falling profile.

11. The system of claim 10, wherein each current level of the second current-level-over-time threshold at any time is larger than each current level of the first current threshold at any given time.

12. The system of claim 3, wherein the third current-level-over-time threshold is represented in a current/time graph by a temperature-dependent, nonlinear characteristic curve that has a substantially exponentially falling profile and corresponds to a line characteristic curve.

13. The system of claim 3, wherein the evaluation unit is further configured to output the disconnection signal only when a third criterion satisfied is a prescribed period since an onset of the first and/or second criterion.

14. The system of claim 3, wherein the evaluation unit is further configured to output a diagnosis or fault signal when the first and/or second criterion is satisfied.

15. The system of claim 3, further comprising:
a memory, and
wherein the evaluation unit is further configured to store one or more of the following pieces of information in the memory at an onset of the first and/or second criterion:
an identifier of the at least one current sensor that has registered an increased current exceeding the first current-level-over-time threshold,
the respective current level, and
a period of occurrence of the increased current.

16. The system of claim 13, wherein the prescribed period is dependent on the respective current level.

* * * * *